United States Patent
Taguchi et al.

(10) Patent No.: US 6,896,172 B2
(45) Date of Patent: May 24, 2005

(54) LEAD-FREE SOLDER PASTE FOR REFLOW SOLDERING

(75) Inventors: Toshihiko Taguchi, Saitama (JP); Satoru Akita, Sohka (JP); Masato Shimamura, Sohka (JP); Ryoichi Suzuki, Saratoga, CA (US); Tetsuya Okuno, San Jose, CA (US)

(73) Assignee: Senju Metal Industry Co., Ltd., Tokyo (JP)

( * ) Notice: Subject to any disclaimer, the term of this patent is extended or adjusted under 35 U.S.C. 154(b) by 69 days.

(21) Appl. No.: 10/854,640

(22) Filed: May 27, 2004

(65) Prior Publication Data

US 2004/0217152 A1 Nov. 4, 2004

Related U.S. Application Data

(62) Division of application No. 09/642,765, filed on Aug. 22, 2000.

(51) Int. Cl.$^7$ ............................ B23K 31/02; B23K 31/00
(52) U.S. Cl. .................................. 228/180.1; 228/248.1
(58) Field of Search ........................... 228/180.1, 248.1; 420/557, 560; 148/23, 24

(56) References Cited

U.S. PATENT DOCUMENTS

| | | | | |
|---|---|---|---|---|
| 4,695,428 A | * | 9/1987 | Ballentine et al. | 420/561 |
| 4,758,407 A | * | 7/1988 | Ballentine et al. | 420/560 |
| 4,778,733 A | * | 10/1988 | Lubrano et al. | 428/647 |
| 4,879,096 A | * | 11/1989 | Naton | 420/561 |
| 5,229,070 A | * | 7/1993 | Melton et al. | 420/557 |
| 5,328,521 A | * | 7/1994 | Keusseyan | 148/22 |
| 5,352,407 A | * | 10/1994 | Seelig et al. | 420/561 |
| 5,382,300 A | * | 1/1995 | Blonder et al. | 148/24 |
| 5,393,489 A | * | 2/1995 | Gonya et al. | 420/561 |
| 5,405,577 A | * | 4/1995 | Seelig et al. | 420/561 |
| 5,427,865 A | * | 6/1995 | Mullen et al. | 428/559 |
| 5,435,968 A | * | 7/1995 | Panthofer | 420/561 |
| 5,527,628 A | * | 6/1996 | Anderson et al. | 428/647 |
| 5,540,379 A | * | 7/1996 | Kazem-Goudarzi et al. | 228/248.5 |
| 5,573,602 A | * | 11/1996 | Banerji et al. | 148/24 |
| 5,698,160 A | * | 12/1997 | Chen et al. | 420/557 |
| 5,863,493 A | * | 1/1999 | Achari et al. | 420/557 |
| 5,918,795 A | * | 7/1999 | Yamaguchi et al. | 228/200 |
| 5,928,404 A | * | 7/1999 | Paruchuri et al. | 75/255 |
| 5,938,862 A | * | 8/1999 | Yeh et al. | 148/400 |
| 6,077,477 A | * | 6/2000 | Sakai et al. | 420/560 |
| 6,156,132 A | * | 12/2000 | Yamashita et al. | 148/400 |
| 6,179,935 B1 | * | 1/2001 | Yamashita et al. | 148/400 |
| 6,228,322 B1 | * | 5/2001 | Takeda et al. | 420/561 |
| 6,231,691 B1 | * | 5/2001 | Anderson et al. | 148/400 |
| 6,241,942 B1 | * | 6/2001 | Murata et al. | 420/561 |
| 6,267,823 B1 | * | 7/2001 | Yamaguchi et al. | 148/24 |
| 6,334,570 B1 | * | 1/2002 | Koshi et al. | 228/180.22 |
| 6,360,939 B1 | * | 3/2002 | Paruchuri et al. | 228/248.5 |

FOREIGN PATENT DOCUMENTS

| | | | |
|---|---|---|---|
| JP | 3027441 | | 3/1993 |
| JP | 3027441 B2 | * | 3/1993 |
| JP | 09295182 A | * | 11/1997 |
| JP | 09295182 | | 11/1997 |
| JP | 11138292 | | 5/1999 |
| JP | 11138292 A | * | 5/1999 |
| JP | 11186712 | | 7/1999 |
| JP | 11186712 A | * | 9/1999 |
| WO | 9709455 | | 3/1997 |
| WO | WO 97/09455 A1 | * | 3/1997 |

OTHER PUBLICATIONS

Laine–Ylijoki et al. "Development and Validation of a Lead–Free Alloy for Solder Paste Applications", IEEE Transactions on Components, Packaging and Manufacturing Technology, Part C, vol. 20, No 3, Jul. 1997, pp. 194–198.*
Laine–Ylijoki et al, "Develoment and Validation of a Lead- –Free Alloy for Solder Paste Applications", IEEE Transactions on Components, Packaging and Manufacturing Technology, Part C, vol. 20, No. 3, Jul. 1997, pp. 194–198.

* cited by examiner

Primary Examiner—Colleen P. Cooke
(74) Attorney, Agent, or Firm—Michael Tobias

(57) ABSTRACT

A lead-free solder paste suitable for reflow soldering includes a plurality of different types of metal powder mixed with a flux. One of the metal powders is a Sn alloy powder. Another of the metal powders is selected from a Sn alloy powder, elemental Ag powder, elemental Cu powder, and elemental Sn powder. Each Sn alloy powder includes 0–8 mass % of Ag, 0–5 mass % of Cu, and at least 80 mass % of Sn. The plurality of metal powders have a composition when melted of 1–5 mass % Ag, 0.5–3 mass % Cu, and a remainder of Sn.

17 Claims, No Drawings

LEAD-FREE SOLDER PASTE FOR REFLOW SOLDERING

REFERENCE TO RELATED APPLICATIONS

This application is a division of U.S. patent application Ser. No. 09/642,765 filed on Aug. 22, 2000.

BACKGROUND OF THE INVENTION

1. Field of the Invention

This invention relates to a lead-free solder paste suitable for soldering electronic components to a printed circuit board, particularly by reflow soldering.

2. Description of the Related Art

Electronic components used in electronic equipment include components equipped with leads and surface mounted devices.

Components with leads have elongated leads installed on the body of the electronic component. When components with leads are soldered to a printed circuit board, the flow soldering method is usually employed.

In the flow soldering method, the elongated leads of a component with leads are inserted into holes formed in a printed circuit board from the top side of the board, and then treatment is performed such as applying flux to the bottom surface of the printed circuit board, preheating, contacting the bottom surface of the board with molten solder, and cooling to solder the leads of the components to lands of the printed circuit board.

Single-function components with leads, such as resistors and capacitors, have elongated leads on both sides of the body of the electronic component, so no matter how small the body of the electronic component is made, the leads still project outwards from the body, so there is a limit to how small the overall size of the component can be made. In the case of components with leads such as transistors and PGA (Pin Grid Array) components having a large number of leads, it is difficult to insert a large number of leads into the holes in a printed circuit board, and there are cases in which all of the leads cannot be inserted into the corresponding holes, and the leads end up being bent.

With surface mounted devices, single-function components such as resistors and capacitors are chip components having an electrode formed at each end of a body, while electronic components in the form of IC packages such as QFP (Quad Flat Package) and SOP (Small Outline Package) devices have a large number of plate-shaped leads installed on both sides of the body or on four side surfaces of the body.

When surface mounted devices are soldered to a printed circuit board, the reflow soldering method is usually employed.

In the reflow soldering method, a small amount of solder paste is applied to selected locations on a printed circuit board using a printing mechanism or a dispenser, electrodes or plate-shaped leads of surface mounted devices are made to coincide with the locations on the printed circuit board where solder has been applied, and the surface mounted devices are disposed on the printed circuit board. The printed circuit board is then heated in a reflow furnace and the solder paste is melted to solder the surface mounted devices to the printed circuit board.

Solder paste used in reflow soldering is a viscous material obtained by mixing a solder alloy in the form of a powder with a flux in the form of a paste.

The solder alloy powder used in a conventional solder paste is a Sn—Pb eutectic alloy. A solder paste employing this alloy has excellent solderability with a low melting point of 183° C., so when reflow soldering is carried out with such a solder paste, solder defects are rare, and soldering can be carried out at a temperature at which electronic components and printed circuit boards will not undergo thermal damage.

The reflow temperature employed in reflow soldering with solder paste is usually 40–50° C. higher than the melting point of the solder alloy in the solder paste, since in this temperature range, spreading of the melted solder is optimal and soldering defects decrease.

Accordingly, reflow soldering with a solder paste containing a eutectic Sn—Pb solder is usually carried out at approximately 230° C., which is roughly 50° C. higher than the melting point of 183° C. of the eutectic solder alloy. A temperature of 230° C. is sufficiently low not to cause thermal damage to electronic components being soldered.

In general, electronic equipment which has become old and difficult to use or has broken and become difficult to repair is disposed of by burial in landfills. If electronic equipment which is disposed of in landfills is contacted by acid rain containing a sulfur component, the acid rain dissolves lead from Sn—Pb solder in the equipment. Rain water containing the lead then permeates into the ground and mixes with underground water and contaminates the underground water.

If underground water containing lead is drunk for long periods of time, the lead accumulates within the body and may cause lead poisoning, so the use of Sn—Pb solder has come to be regulated. For this reason, the use of lead-free solder has been recommended.

Among the most common lead-free solders are alloys having Sn as a primary component, such as Sn—Ag alloys, Sn—Cu alloys, Sn—Bi alloys, and Sn—Zn alloys.

However, lead-free solders which have been thus far proposed have various problems, as described below.

A Sn—Ag solder alloy has a Sn-3.5Ag eutectic composition with a melting point of 220° C., so a Sn—Ag solder alloy employs a reflow temperature of at least 260° C., at which temperature electronic components can easily be thermally damaged. It is possible to lower the solidus temperature of a Sn—Ag solder alloy by the addition of a small amount of Bi or In, but the liquidus temperature (melting point) of the alloy can not be decreased. Furthermore, a Sn—Ag solder alloy has no surface gloss after soldering, so the value of the soldered product is decreased.

A Sn—Cu solder alloy has a Sn-0.7Cu eutectic composition with a high melting point of 227° C., so it is difficult to avoid thermal damage to electronic components when performing soldering with this alloy. Furthermore, it has relatively poor solderability. As is the case with a Sn—Ag solder alloy, addition of a small amount of Bi or In is not effective to decrease the melting point of a Sn—Cu solder alloy.

A Sn—Bi solder alloy has a Sn-57Bi eutectic composition with a low melting point of 139° C., so the reflow temperature of this alloy is lower than that for a conventional Sn—Pb eutectic solder. Thus, there is no worry whatsoever of thermal damage to electronic components during reflow soldering with this solder alloy. However, it is extremely brittle, so after soldering, peeling of soldered joints readily occurs if the joints are subjected to an impact.

A Sn—Zn solder alloy has a Sn-9Zn eutectic composition with a melting point of 199° C., so a typical reflow temperature is 240° C., at which temperature there is little possibility of thermal damage to electronic components. However, a large amount of oxides are formed at the time of reflow soldering with this solder alloy, and it also has poor solderability.

Thus, none of the conventional lead-free solder alloys described above is acceptable both with respect to its melting temperature and its physical properties.

One possible way of obtaining a lead-free solder paste having an acceptably low melting point is to mix a powder of a lead-free solder having a high melting point with a powder of a lead-free solder having a low melting point.

Japanese Published Unexamined Patent Application No. 9-295182/1997 discloses an invention in which at least two types of solder alloy powder with Sn as a principal component are mixed, and using the difference in specific gravity of the alloy powders, a composition which varies with depth is obtained. That invention is aimed at improving wettability and soldered strength. However, the examples of that application do not mention the reflow temperature.

Japanese Published Unexamined Patent Application No. 11-138292/1999 discloses a solder paste which in order to obtain a multi-element solder alloy uses an easily manufactured binary alloy powder and an elemental metal powder or two or more types of binary alloy powder. This composition contributes to a delay in melting at the time of reflow soldering and prevention of tombstoning of minute chip components. However, while there is mention in the examples of the temperature at the start of melting and the final melting temperature (181–219° C.), there is no disclosure concerning the reflow temperature.

The solder paste disclosed in No. 11-138292/1999 uses an alloy powder containing one of Bi, In, and Zn, but each of these elements causes problems in solder. As mentioned above, the addition of Bi to a solder alloy leads to brittle fracture of soldered portions. An In metal powder or an In alloy powder in a solder paste reacts with flux in the solder paste and produces degradation with the passage of time, and the solder paste soon becomes unusable. When a lead-free solder contains Zn, a large amount of oxides are produced at the time of soldering. Oxides are not only an impediment to solderability, but large voids are formed in the soldered portions and the bonding strength becomes weak.

Japanese Published Unexamined Patent Application No. 11-186712/1999 discloses a solder paste including at least two types of alloy powder having different compositions and different melting points. The solder paste of that invention enables the reflow temperature to be lowered from the conventional value of 260° C. down to 230° C. As shown in the examples of that application, it is necessary to use a Sn-58% Bi solder alloy (melting point of 139° C.). As a result, the apparent melting point of the final alloy composition, which is Sn-3Ag-4Bi (melting point of 210° C.) or Sn-6Bi-1.5Ag-0.4Cu (melting point of 195–214° C.), is lowered. However, either composition contains Bi, so brittle fracture of soldered portions can readily take place after soldering.

Japanese Patent No. 3027441 discloses a lead-free solder alloy having mechanical strength, gloss after soldering, and impact resistance superior to those of the above-described conventional lead-free solders.

The lead-free solder alloy of that patent is a Sn—Ag—Cu lead-free solder containing 3–5 mass % of Ag, 0.5–3 mass % of Cu, and a remainder of Sn as a main component. It does not undergo deterioration of bonding strength, and a powder of such an alloy does not react with flux in solder paste, so it suffers almost no degradation with the passage of time.

Thus, a Sn—Ag—Cu lead-free solder alloy has superior properties compared to lead-free solders of other compositions, but the lowest melting point thereof is 217° C., and in order to obtain satisfactory wettability of molten solder during reflow soldering with this alloy and avoid the formation of voids in soldered joints, it is necessary for the reflow temperature to be at least 260° C. However, a temperature this high is undesirable from the standpoint of preventing thermal damage to electronic components and printed circuit boards. Therefore, in order to prevent thermal damage, reflow soldering with a Sn—Ag—Cu lead-free solder has typically been carried out at a reflow temperature of at most 250° C., preferably at most 240° C., at which temperature wettability may be inadequate and the occurrence of voids may be high, since it is only about 30° C. higher than the lowest melting point of a Sn—Ag—Cu alloy.

Furthermore, with a solder paste containing a powder of a conventional Sn—Ag—Cu lead-free solder alloy, regardless of the reflow temperature, tombstoning (a phenomenon in which chip components stand up on one end during reflow soldering) is a frequent problem.

SUMMARY OF THE INVENTION

An object of the present invention is to provide a lead-free solder paste which can form soldered joints with excellent mechanical properties and gloss.

Another object of the present invention is to provide a lead-free solder paste which has excellent wettability and does not result in the formation of voids in soldered joints, even at a reflow temperature of 250° C. or below, without the use of Bi.

Still another object of the present invention is to provide a lead-free solder paste containing a Sn—Ag—Cu lead-free solder alloy powder which can prevent the occurrence of tombstoning during reflow soldering.

Yet another object of the present invention is to provide a lead-free solder paste containing a Sn—Ag—Cu lead-free solder alloy powder having good printability.

A further object of the present invention is to provide a method of reflow soldering using such a lead-free solder paste.

The conventional method of lowering the reflow temperature of a Sn—Ag—Cu solder paste is to add an alloying element such as Bi to lower the melting point of the resulting solder alloy. However, as described above, the addition of Bi leads to embrittlement. The present inventors found that instead of adding an element such as Bi, it is effective to form a Sn—Ag—Cu solder paste from a mixture of two or more different types of metal powders having different melting points, with at least one of the powders being a Sn alloy. The use of a mixture of different types of metal powders prolongs the time required for the metal powders to completely melt during reflow soldering at a given reflow temperature. The prolonged melting time prevents the formation of voids in soldered portions, even when the reflow temperature is less than 40–50° C. above the melting point of the resulting solder alloy. At the same time, tombstoning (which is a common problem with conventional Sn—Ag—Cu solder alloys) does not take place. Thus, reflow soldering can be carried out at a lower reflow temperature than is considered suitable for conventional Sn—Ag—Cu solder alloys, thereby avoiding thermal damage to electronic components and printed circuit boards during reflow soldering.

According to one aspect of the present invention, a lead-free solder paste includes a plurality of different types of metal powder mixed with a flux. At least one of the metal powders is a Sn alloy powder, while another of the metal powders is selected from a Sn alloy powder, elemental Ag powder, elemental Cu powder, and elemental Sn powder. Each Sn alloy powder includes 0–8 mass % of Ag, 0–5 mass % of Cu, and at least 80 mass % of Sn. When the plurality of powders are melted, they have a composition of 1–5 mass % of Ag, 0.5–3 mass % of Cu, and a remainder of Sn.

According to another aspect of the present invention, a method of soldering a surface mounted device includes performing reflow soldering using the above-described lead-free solder paste.

A solder paste according to the present invention can provide soldered joints having excellent mechanical strength, gloss, and impact resistance, but at the same time, soldering can be carried out at a moderate temperature of 250° C. or below, preferably 240° C. or below at which damage to electronic components and printed circuit boards can be avoided. Since the solder paste does not require the use of Bi, it does not have the problems of embrittlement of Bi-containing solder alloys.

An unexpected characteristic of a solder paste according to the present invention is that it has both excellent wettability and printability. Here, printability refers to the ability of solder paste which has been printed on a printed circuit board to retain an upwardly projecting shape while melting and solidifying during reflow soldering. Printability is an indicator of the reliability of solderability. The fact that a solder paste according to the present invention has excellent wettability and printability makes it highly suitable for reflow soldering.

DESCRIPTION OF PREFERRED EMBODIMENTS

The metal powders which can be used in a solder paste according to the present invention include Sn alloy powders in which Sn is alloyed with one or both of Ag and Cu (i.e., Sn—Ag alloys, Sn—Cu alloys, and Sn—Ag—Cu alloys), and elemental metal powders of Sn, Ag, or Cu. When the metal powders include two or more different alloy powders, the two alloy powders may differ from each other with respect to their components (such as Sn—Ag alloy powder and Sn—Cu alloy powder), or the different alloy powders may contain the same components but in different proportions (such as Sn-0.5Ag-0.1Cu alloy powder and Sn-3Ag-1Cu powder).

The overall composition of the metal powders after melting is 1–5 mass % of Ag, 0.5–3 mass % of Cu, and a remainder of Sn. The reasons for these limitations is as follows.

If the Ag content is less than 1 mass %, solderability of the solder paste becomes poor, while if it exceeds 5 mass %, the solder becomes too hard and the impact resistance of soldered joints becomes poor. Preferably the Ag content is at least 1.0 mass % and at most 4.0 mass %.

If the Cu content is less than 0.5 mass %, the mechanical strength of soldered joints is not adequate, and if it exceeds 3 mass %, the melting point of the solder paste becomes too high and electronic components or printed circuit boards may undergo thermal damage at the time of reflow soldering. Preferably, the Cu content is at least 0.5 mass % and at most 1.0 mass %.

There are no particular limits on the particle diameter of the metal powders. As with existing solder pastes, the particle diameter of the metal powders will typically be on the order of 10–70 μm. In some cases, depending upon the purpose, it may be desirable for one metal powder to have a coarse particle diameter and another metal powder to have a fine particle diameter.

EXAMPLES

A solder paste according to the present invention will be described in further detail by the following examples.

Examples of a solder paste according to the present invention and comparative examples were prepared by mixing 89 mass % of the metal powders having the compositions shown in Table 1 with 11 mass % of flux to form a paste. The metal powders had a particle diameter of 10–70 μm. The flux had the following composition:

| | |
|---|---|
| Polymerized rosin (resin) | 50 mass % |
| Hexylene glycol (solvent) | 44 mass % |
| Diphenylguanidine HBr (activator) | 1 mass % |
| Hardened castor oil (thixotropic agent) | 5 mass % |

Examples 1-1 to 1-4 and Comparative Example 1 each had a composition of Sn-3.9Ag-0.6Cu after melting, while Examples 2-1 to 2-4 and Comparative Example 2 each had a composition of Sn-3.0Ag-0.5Cu after melting. The examples of the present invention each included at least two different types of metal powder, whereas the comparative examples each included only a single type of metal powder.

Each of the solder pastes was tested for the occurrence of voids, the occurrence of tombstoning, and printability in the following manner.

In the voids test, solder paste was applied to pads at 35 locations on a printed circuit board, which was then heated in air in a reflow furnace at a reflow temperature of 240° C. The soldered portions were then observed with an X-ray inspection apparatus to measure the number of voids. The total number of voids developed at the 35 pads is shown in Table 1.

In the tombstoning test, 320 type-0402 chip components (rectangular chip components measuring 0.4 mm by 0.2 mm) and 360 type-0603 chip components (rectangular chip components measuring 0.6 mm by 0.3 mm) for a total of 680 chip components were mounted on a printed circuit board to which the solder pastes of Table 1 had been applied. Reflow soldering was then carried out in a reflow furnace containing a nitrogen gas atmosphere with an oxygen concentration of at most 100 ppm and a reflow temperature of 240° C. The proportion(%) of the chip components which underwent tombstoning is shown in Table 1.

In the printability test, the solder pastes shown in Table 1 were printed by screen printing on a substrate using a screen with a thickness of 150 μm and having a QFP pattern with a pitch of 0.4 mm formed thereon. The substrate was then heated to 240° C., after which the soldered portions were observed with a stereo microscope. Examples in which there was no dewetting of the soldered portions on the substrate and in which the solder had melted while keeping its printed shape are indicated by a ○ in Table 1, while examples in which dewetting was observed or in which the solder did not melt are indicated by an X. Dewetting of the soldered portions refers to the phenomenon in which melted solder does not wet the substrate so that thorough bonding does not occur.

TABLE 1

| | 1st Powder | Mass (%) | 2nd Powder | Mass % | 3rd Powder | Mass % | Composition after melting | Voids | Tombstoning (%) | Print ability |
|---|---|---|---|---|---|---|---|---|---|---|
| Example 1-1 | Sn—1.0Ag—0.5Cu | 50 | Sn—6.8Ag—0.7Cu | 50 | — | — | Sn—3.9Ag—0.6Cu | 41 | 0.4 | ○ |
| Example 1-2 | Sn—5.6Ag | 70 | Sn—2.0Cu | 30 | — | — | | 18 | 0.09 | ○ |
| Example 1-3 | Sn—7.8Ag | 50 | Sn—1.2Cu | 50 | — | — | | 15 | 0.1 | ○ |
| Example 1-4 | Sn—5.6Ag | 35 | Sn—2.0Cu | 15 | Sn—3.9Ag—0.6Cu | 50 | | 38 | 0.21 | ○ |
| Comparative Example 1 | Sn—3.9Ag—0.6Cu | 100 | — | — | — | — | | 161 | 0.67 | X |
| Example 2-1 | Sn—1.0Ag—0.5Cu | 50 | Sn—5.0Ag—0.5Cu | 50 | — | — | Sn—3.0Ag—0.5Cu | 45 | 0.26 | ○ |
| Example 2-2 | Sn—4.0Ag | 75 | Sn—2.0Cu | 25 | — | — | | 16 | 0.12 | ○ |
| Example 2-3 | Sn—6.0Ag | 50 | Sn—1.0Cu | 50 | — | — | | 18 | 0.15 | ○ |
| Example 2-4 | Sn—4.0Ag | 37.5 | Sn—2.0Cu | 12.5 | Sn—3.0Ag—0.5Cu | 50 | | 30 | 0.13 | ○ |
| Comparative Example 2 | Sn—3.0Ag—0.5Cu | 100 | — | — | — | — | | 172 | 0.72 | X |

From this table, it can be seen that all of the examples of solder pastes according to the present invention had a low occurrence of voids and tombstoning and good printability, in spite of the fact that conventional Sn—Ag—Cu solder alloys typically have problems with respect to tombstoning and the fact that the solder pastes were heated to a relatively low reflow temperature at which the generation of voids is normally a problem. In contrast, both of the comparative examples had a high occurrence of voids and tombstoning and poor printability, despite having the same overall composition after melting as the examples of the present invention.

What is claimed is:

1. A method of soldering a surface mounted device comprising performing reflow soldering using a lead-free solder paste including a plurality of different types of metal powder mixed with a flux, one of the metal powders being a Sn alloy powder, another of the metal powders being selected from a Sn alloy powder, elemental Ag powder, elemental Cu powder, and elemental Sn powder, each Sn alloy powder including 0–8 mass % of Ag, 0–5 mass % of Cu, and at least 80 mass % of Sn, the plurality of metal powders having a composition when melted of 1–5 mass % Ag, at least 0.5 and less than 3 mass % Cu, and a remainder of Sn, the reflow soldering including melting the plurality of metal powders in the solder paste.

2. A method as claimed in claim 1 wherein one of the metal powders comprises an elemental metal powder of Ag, Cu or Sn.

3. A method as claimed in claim 1 wherein the plurality of metal powders have a composition when melted containing at most 1.0 mass % of Cu.

4. A method as claimed in claim 1 including completely melting the plurality of metal powders in the reflow soldering.

5. A method as claimed in claim 1 including completely melting the plurality of metal powders in a single reflow step.

6. A method as claimed in claim 1, wherein the plurality of metal powders include two different Sn alloy powders.

7. A method as claimed in claim 6 wherein the two Sn alloy powders contain the same components as each other in different proportions.

8. A method as claimed in claim 6 wherein the plurality of metal powders include two different Sn—Ag—Cu alloy powders.

9. A method as claimed in claim 6 wherein one of the metal powders is a Sn—Ag alloy powder and another of the metal powders is a Sn—Cu alloy powder.

10. A method as claimed in claim 6 wherein the plurality of metal powders include a Sn—Ag alloy powder, a Sn—Cu alloy powder, and a Sn—Ag—Cu alloy powder.

11. A method as claimed in claim 6 including performing the reflow soldering at a reflow temperature of at most 250° C.

12. A method as claimed in claim 11 wherein the reflow temperature is at most 240° C.

13. A method as claimed in claim 6 wherein the surface mounted device comprises a chip component.

14. A method as claimed in claim 6 including printing the solder paste on a printed circuit board.

15. A method as claimed in claim 6 wherein the plurality of metal powders have a composition when melted containing at most 1.0 mass % of Cu.

16. A method as claimed in claim 6 including completely melting the plurality of metal powders in the reflow soldering.

17. A method as claimed in claim 16 including completely melting the plurality of metal powders in a single reflow step.

* * * * *